United States Patent
Huang

(10) Patent No.: US 10,141,954 B2
(45) Date of Patent: Nov. 27, 2018

(54) DATA ERROR CORRECTING METHOD AND DEVICE, AND COMPUTER STORAGE MEDIUM

(71) Applicant: Sanechips Technology Co., Ltd., Shenzhen (CN)

(72) Inventor: Yiyuan Huang, Shenzhen (CN)

(73) Assignee: Sanechips Technology Co., Ltd., Shenzhen, Guangdong (CN)

(*) Notice: Subject to any disclaimer, the term of this patent is extended or adjusted under 35 U.S.C. 154(b) by 0 days.

(21) Appl. No.: 15/108,936

(22) PCT Filed: May 20, 2014

(86) PCT No.: PCT/CN2014/077931
§ 371 (c)(1),
(2) Date: Jun. 29, 2016

(87) PCT Pub. No.: WO2015/100917
PCT Pub. Date: Jul. 9, 2015

(65) Prior Publication Data
US 2016/0329912 A1    Nov. 10, 2016

(30) Foreign Application Priority Data

Dec. 30, 2013 (CN) .......................... 2013 1 0749647

(51) Int. Cl.
*H03M 13/29* (2006.01)
*G06F 11/10* (2006.01)
(Continued)

(52) U.S. Cl.
CPC ........ *H03M 13/2906* (2013.01); *G06F 3/064* (2013.01); *G06F 3/0619* (2013.01);
(Continued)

(58) Field of Classification Search
CPC ................................................ H03M 13/2957
(Continued)

(56) References Cited

U.S. PATENT DOCUMENTS

| 5,502,732 A | 3/1996 | Arroyo |
| 6,374,382 B1 | 4/2002 | Solomon |

(Continued)

FOREIGN PATENT DOCUMENTS

| CN | 1523799 A | 8/2004 |
| CN | 101227263 A | 7/2008 |

(Continued)

OTHER PUBLICATIONS

Supplementary European Search Report in European application No. 14876707.2, dated Feb. 3, 2017.
(Continued)

*Primary Examiner* — Fritz Alphonse
(74) *Attorney, Agent, or Firm* — Oppedahl Patent Law Firm LLC

(57) ABSTRACT

Provided are a data error correcting method and device, and computer storage medium, the method comprising: respectively setting an index number for each data bit, and generating a first check code according to the index number; and generating a second check code according to the first check code, comparing the first check code with the second check code to determine an erroneous data bit, and correcting the erroneous data bit. The device comprises: a setting module configured to respectively set the index number for each data bit; a first check code generation module configured to generate the first check code according to the index number; a second check code generation module configured to generate the second check code according to the first check code; and a data processing module configured to compare
(Continued)

the first check code with the second check code to determine an erroneous data bit, and correct the erroneous data bit.

12 Claims, 2 Drawing Sheets

(51) Int. Cl.
*G06F 3/06* (2006.01)
*G11C 29/52* (2006.01)
*H03M 13/19* (2006.01)
*H03M 13/09* (2006.01)

(52) U.S. Cl.
CPC ........ *G06F 3/0679* (2013.01); *G06F 11/1004* (2013.01); *G06F 11/1068* (2013.01); *G11C 29/52* (2013.01); *H03M 13/098* (2013.01); *H03M 13/19* (2013.01)

(58) Field of Classification Search
USPC .................................. 714/755, 758, 763, 769
See application file for complete search history.

(56) References Cited

U.S. PATENT DOCUMENTS

| | | | |
|---|---|---|---|
| 6,973,612 B1* | 12/2005 | Rodi | G06F 11/1008 714/766 |
| 8,156,398 B2 | 4/2012 | Sommer | |
| 8,156,404 B1 | 4/2012 | Glasco | |
| 8,255,773 B2 | 8/2012 | D Abreu | |
| 8,321,752 B1* | 11/2012 | Yang | H03M 13/1102 714/757 |
| 8,972,834 B2* | 3/2015 | Eroz | H03M 13/1105 714/790 |
| 2007/0136644 A1 | 6/2007 | Katagiri | |
| 2010/0169742 A1 | 7/2010 | Hopkins | |
| 2010/0332949 A1 | 12/2010 | D Abreu | |
| 2014/0047300 A1* | 2/2014 | Liang | H03M 13/271 714/766 |

FOREIGN PATENT DOCUMENTS

| | | |
|---|---|---|
| CN | 101625653 A | 1/2010 |
| CN | 102110028 A | 6/2011 |
| CN | 102654854 A | 9/2012 |
| CN | 102789806 A | 11/2012 |
| CN | 102804146 A | 11/2012 |
| CN | 102812519 A | 12/2012 |
| KR | 20080090135 A | 10/2008 |

OTHER PUBLICATIONS

International Search Report in international application No. PCT/CN2014/077931, dated Oct. 10, 2014.
English Translation of the Written Opinion of the International Search Authority in international application No. PCT/CN2014/077931, dated Oct. 10, 2014.

* cited by examiner

Fig. 1
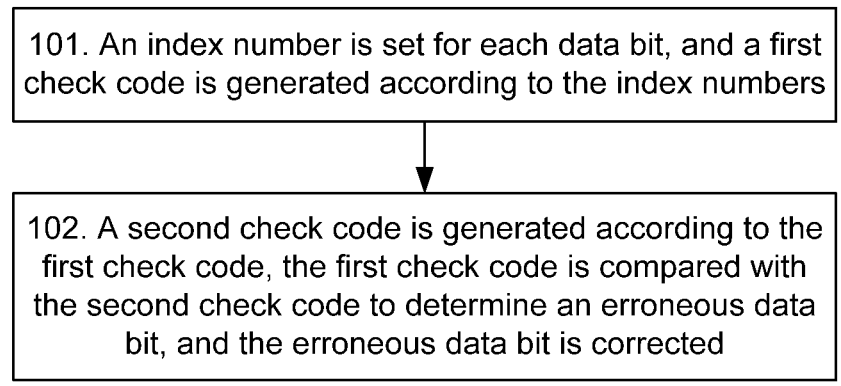
Fig. 2
Fig. 3
| Data bit | Binary index number |
|---|---|
| D0 | 000 |
| D1 | 001 |
| D2 | 010 |
| D3 | 011 |
| D4 | 100 |
| D5 | 101 |
| D6 | 110 |
| D7 | 111 |
| First check code | C2C1C0 |

DATA ERROR CORRECTING METHOD AND DEVICE, AND COMPUTER STORAGE MEDIUM

TECHNICAL FIELD

The disclosure relates to an error correcting technology in the field of coding and decoding, and in particular to a method and apparatus for correcting data error, and a computer storage medium.

BACKGROUND

Currently, an Error Checking and Correcting (ECC) technology used in a Random Access Memory (RAM) is mainly implemented by using a Hamming code, and the technology has functions of correcting an error of 1 bit and detecting errors of 2 bits. The ECC technology is implemented usually aiming at a certain width of data bit, and typical widths of data bit may be 32 bits, 64 bits, 128 bits or the like. Data bits of original data may be regarded as a matrix in which the data bits are arranged in rows and columns, odd-even check is performed on the rows and the columns to generate a check code, and the check code and the original data are written into and saved in the RAM. During data reading, the original data and the check code are read out together from the RAM, a new check code may be generated by means of the same algorithm, and furthermore, an erroneous row and column during data reading can be determined by comparing the two check codes to obtain a difference therebetween, thereby determining an erroneous data bit during data reading.

In the above method, it is necessary for a high-bit part and low-bit part of a data bit to participate in generation of each check code, when a data bit width changes, it is needed to change a polynomial generated from the matrix correspondingly, and therefore the method is lower in generality.

SUMMARY

In view of this, the embodiments of the disclosure are intended to provide method and apparatus for correcting a data error, and a computer storage medium, which can improve the generality of an algorithm and reduce the scale of a check code.

To this end, the technical solutions of the embodiments of the disclosure are implemented as follows.

According to an embodiment of the disclosure, a data error correcting method is provided, which may include that:

an index number is set for each data bit, and a first check code is generated according to the index numbers; and a second check code is generated according to the first check code, the first check code is compared with the second check code to determine an erroneous data bit, and the erroneous data bit is corrected.

Preferably, the step that the index number is set for each data bit may include that: a binary index number is set for each data bit in an order of data bits.

Preferably, the step that the first check code is generated according to the index numbers may include that: first check code generation expressions are obtained according to the binary index numbers, and a first check code is generated according to the first check code generation expressions; and the step that the first check code generation expressions are obtained according to the binary index numbers and the first check code is generated according to the first check code generation expressions may include that: for the binary index numbers for the respective data bits, an exclusive-or operation is performed on data bits for which corresponding bits of respective binary index numbers are 1 or 0, a first check code generation expression of each index number bit is obtained, and a result of the first check code generation expression of each index number bit is taken as a corresponding bit of the first check code.

Preferably, the step that the second check code is generated according to the first check code may include that:

an exclusive-or operation is performed on data bits of input data, for which corresponding bits of respective binary index numbers are 1 or 0 for the binary index numbers for the respective data bits of the input data, and a second check code generation expression of each index number bit is obtained, and a result of the second check code generation expression of each index number bit is taken as a corresponding bit of the second check code.

Preferably, the step that the first check code is compared with the second check code to determine the erroneous data bit and the erroneous data bit is corrected may include that:

an exclusive-or operation is performed on each bit of the first check code and a corresponding bit of the second check code to obtain a corresponding bit of a third check code, when it is determined that the corresponding bits of the first check code and the second check code are inconsistent according to the third check code, an erroneous data bit is determined according to the first check code generation expressions of the corresponding bits of the first check code, and the erroneous data bit is corrected.

According to an embodiment of the disclosure, an apparatus for correcting data error is also provided, which may include: a setting module, a first check code generation module, a second check code generation module and a data processing module, wherein the setting module is configured to set an index number for each data bit;

the first check code generation module is configured to generate a first check code according to the index numbers;

the second check code generation module is configured to generate a second check code according to the first check code; and the data processing module is configured to compare the first check code with the second check code to determine an erroneous data bit, and correct the erroneous data bit.

Preferably, the setting module may be configured to set a binary index number for each data bit in an order of data bits.

Preferably, the first check code generation module may be configured to perform an exclusive-or operation on data bits for which corresponding bits of respective binary index numbers are 1 or 0 for the binary index numbers for the respective data bits, and obtain a first check code generation expression of each index number bit, and take a result of the first check code generation expression of each index number bit as a corresponding bit of the first check code.

Preferably, the second check code generation module may be configured to perform an exclusive-or operation on data bits of input data, for which corresponding bits of respective binary index numbers are 1 or 0 for the binary index numbers for the respective data bits of the input data, and obtain a second check code generation expression of each index number bit, and take a result of the second check code generation expression of each index number bit as a corresponding bit of the second check code.

Preferably, the data processing module may be configured to perform an exclusive-or operation on each bit of the first check code and a corresponding bit of the second check code to obtain a corresponding bit of a third check code, determine, when it is determined that the corresponding bits of the first check code and the second check code are inconsistent according to the third check code, an erroneous data bit according to the first check code generation expressions of the corresponding bits of the first check code, and correct the erroneous data bit.

According to an embodiment of the disclosure, a computer storage medium is also provided. Computer executable instructions may be stored in the computer storage medium and may be configured to perform the above method.

By means of the method and apparatus for correcting data error, and the computer storage medium provided by the embodiments of the disclosure, an index number is set for each data bit, and a first check code is generated according to the index numbers; and a second check code is generated according to the first check code, the first check code is compared with the second check code to determine an erroneous data bit, and the erroneous data bit is corrected. In such a way, the first check code can be obtained on the basis of the index number set for each data bit, the second check code is obtained on the basis of the first check code, and the erroneous data bit is determined by comparing the first check code with the second check code; and as the above process is not limited by data bit width and only some pieces of data participate in generation of each check bit of the first check code and each check bit of the second check code, the method may be reused to various occasions while reducing the scales of the check codes, thereby having higher generality.

BRIEF DESCRIPTION OF THE DRAWINGS

FIG. 1 is a schematic flowchart of an implementation of a data error correcting method embodiment of the disclosure;

FIG. 2 is a schematic diagram showing data bits of 8-bit data according to an embodiment of the disclosure;

FIG. 3 is a schematic diagram showing a correspondence relationship between data bits of 8-bit data and binary index numbers according to an embodiment of the disclosure;

DETAILED DESCRIPTION

Figure 4:
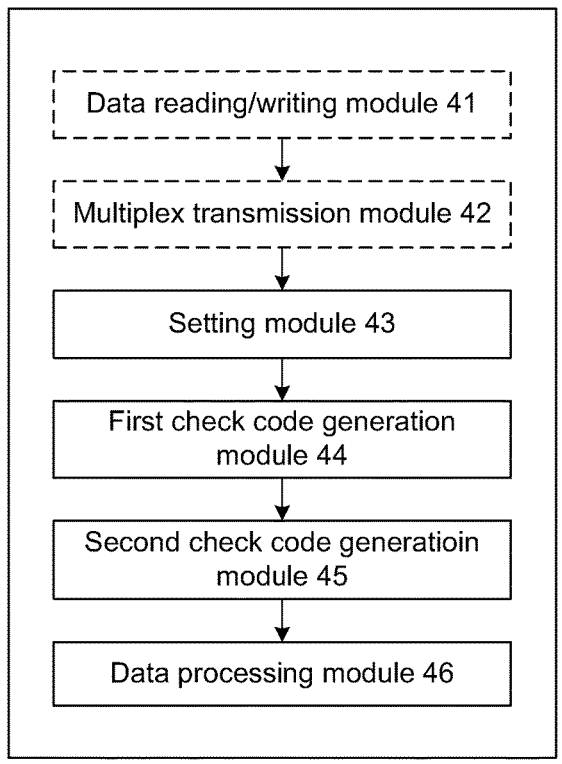
FIG. 4 is a schematic diagram of a composition structure of a data error correcting apparatus embodiment of the disclosure.

In the embodiments of the disclosure, an index number is set for each data bit, and a first check code is generated according to the index numbers; and a second check code is generated according to the first check code, the first check code is compared with the second check code to determine an erroneous data bit, and the erroneous data bit is corrected and then output.

In the embodiments of the disclosure, when it is needed to perform data reading or data writing, a reading/writing selection signal determines whether data reading or data writing is performed currently, and a binary index number is set for each data bit, there are a one-to-one correspondence relationship between the binary index numbers and the data bits.

For the binary index numbers for the respective data bits, an exclusive-or operation is performed on data bits for which corresponding bits of respective binary index numbers are 1 or 0, and obtain a first check code generation expression of each index number bit; after the first check code generation expression of each index number bit is obtained, a result of the first check code generation expression of each index number bit is taken as a corresponding bit of the first check code, and in such a way, each check bit of the first check code may be obtained; and it can be seen that the number of bits of the first check code is identical to that of the binary index number.

During data reading or data writing, the second check code is generated by means of an algorithm similar to an algorithm for generating the first check code, and correspondingly, the number of bits the second check code is identical to that of the first check code and that of the binary index number.

In practical application, it is not needed to perform error correction for data writing, and therefore written data may be directly output after the first check code and the second check code are obtained; during data reading, if a certain data bit is erroneous, a corresponding bit in the second check code will change; and the erroneous data bit may be determined by comparing the first check code with the second check code, wherein the reading/writing selection signal may control an entire circuit to perform an error correcting operation or an operation of generating the first check code and the second check code.

Specifically, during data reading, by performing an exclusive-or operation on corresponding bits of the first check code and the second check code, each corresponding bit of a third check code may be obtained, it may be concluded that a certain check bit of the first check code is inconsistent with a certain check bit of the second check code in a data reading process according to data of each check bit in the third check code, and then an erroneous data bit is obtained according to a first check code generation expression corresponding to the check bit.

In practical application, the first check code is probably erroneous in an access process, so that an inspection check code is further set, and it is judged whether the first check code is erroneous in the access process by means of the change of the inspection check code; and if the first check code is erroneous, it is not needed to perform an error correcting operation, and it is directly reported, to an operating system, that the first check code is erroneous.

The disclosure is further illustrated below in detail together with drawings and specific embodiments.

According to an embodiment of the disclosure, a method for correcting data error is provided. Data input may be data writing or data reading, and a reading/writing selection signal determines whether data reading or data writing is performed currently. FIG. 1 is a schematic flowchart of an implementation of a data error correcting method embodiment of the disclosure. As shown in FIG. 1, by taking 8-bit data as an example, the method includes the steps as follows.

Step 101: An index number is set for each data bit, and a first check code is generated according to the index numbers.

In this step, each data bit is marked in an order of the data bits. As shown in FIG. 2, FIG. 2 is a schematic diagram showing data bits of 8-bit data according to an embodiment of the disclosure. The 8-bit data is marked with D0, D1, D2, D3, D4, D5, D6 and D7 from a low bit to a high bit, and therefore corresponding decimal index numbers, from a low bit to a high bit, of the 8-bit data are 0, 1, 2, 3, 4, 5, 6 and 7 in sequence; a binary index number corresponding to the decimal index number is set for each bit of the 8-bit data in order of data bits, the decimal index numbers 0-7 may be represented by 3-bit binary number respectively, and therefore the corresponding binary index numbers, from a low bit to a high bit, of the 8-bit data are 000, 001, 010, 011, 100, 101, 110 and 111 in sequence; and the binary index number of each data bit, represented by 3-bit binary number, is composed of a high bit, second low bit and low bit of the binary index number from left to right in sequence.

FIG. 3 is a schematic diagram showing a correspondence relationship between data bits of 8-bit data and binary index numbers according to an embodiment of the disclosure. As shown in FIG. 3, the first check code may also be represented by 3-bit binary number, and correspondingly, the first check code represented by 3-bit binary number is composed of a high bit $C_2$, second low bit $C_1$ and low bit $C_0$ of the first check code from left to right in sequence.

Specifically, for the binary index numbers for the respective data bits, an exclusive-or operation is performed on data bits for which corresponding bits of respective binary index numbers are 1 or 0, and a first check code generation expression of each index number bit is obtained. For example, an exclusive-or operation is performed on data bits 1 in high bits, second low bits and low bits of respective index numbers, the first check code generation expression of each index number bit is obtained, and a specific operation process is shown in the following formulae:

$$C_0 = D_1 \string^ D_3 \string^ D_5 \string^ D_7 \quad (1)$$

where $C_0$ represents a result of performing an exclusive-or operation on all data bits for which low bits of binary index numbers are 1, and $D_1 \string^ D_3 \string^ D_5 \string^ D_7$ is a first check code generation expression of the low bits;

$$C_1 = D_2 \string^ D_3 \string^ D_6 \string^ D_7 \quad (2)$$

where $C_1$ represents a result of performing an exclusive-or operation on all data bits for which second low bits of binary index numbers are 1, and $D_2 \string^ D_3 \string^ D_6 \string^ D_7$ is a first check code generation expression of the second low bits;

$$C_2 = D_4 \string^ D_5 \string^ D_6 \string^ D_7 \quad (3)$$

where $C_2$ represents a result of performing an exclusive-or operation on all data bits for which high bits of binary index numbers are 1, and $D_4 \string^ D_5 \string^ D_6 \string^ D_7$ is a first check code generation expression of the high bits;

furthermore, a first total check code may be set for the first check code, and specifically, as shown in Formula (4):

$$C_a = D_0 \string^ D_1 \string^ D_2 \string^ D_3 \string^ D_4 \string^ D_5 \string^ D_6 \string^ D_7 \quad (4)$$

where $C_a$ represents a result of performing an exclusive-or operation on all data bits and is a first total check code, and $D_0 \string^ D_1 \string^ D_2 \string^ D_3 \string^ D_4 \string^ D_5 \string^ D_6 \string^ D_7$ is a first total check code generation expression; and $$C = C_2 C_1 C_0 \quad (5)$$

where C represents a first check code, $C_0$ represents a result of performing an exclusive-or operation on all data bits for which low bits of binary index numbers are 1, $C_1$ represents a result of performing an exclusive-or operation on all data bits for which second low bits of binary index numbers are 1, and $C_2$ represents a result of performing an exclusive-or operation on all data bits for which high bits of binary index numbers are 1.

Specifically, as shown in Formula (5), after the first check code generation expression of each index number bit is obtained, a result of the first check code generation expression of each index number bit is taken as a corresponding bit of the first check code. That is, the result $C_0$ of the first check code generation expression $D_1 \string^ D_3 \string^ D_5 \string^ D_7$ of the low bit is taken as a low bit of the first check code; the result $C_1$ of the first check code generation expression $D_2 \string^ D_3 \string^ D_6 \string^ D_7$ of the second low bit is taken as a second low bit of the first check code; the result $C_2$ of the first check code generation expression $D_4 \string^ D_5 \string^ D_6 \string^ D_7$ of the high bit is taken as a high bit of the first check code; and in such a way, each check bit of the first check code is obtained.

Step 102: A second check code is generated according to the first check code, the first check code is compared with the second check code to determine an erroneous data bit, and the erroneous data bit is corrected.

In this step, during data reading or data writing, the second check code is generated by means of an algorithm similar to an algorithm for generating the first check code, correspondingly, the second check code may also be represented by 3-bit binary number, and the second check code represented by 3-bit binary number is composed of a high bit $C'_2$, second low bit $C'_1$ and low bit $C'_0$ of the second check code from left to right in sequence.

Specifically, for the binary index numbers for the respective data bits of the input data, an exclusive-or operation is performed on data bits of input data, for which corresponding bits of respective binary index numbers are 1 or 0, and a second check code generation expression of each index number bit is obtained. For example, an exclusive-or operation is performed on data bits for which high bits, second low bits and low bits of respective index numbers are 1, the second check code generation expression of each index number bit is obtained, and a specific operation process is shown in the following formulae:

$$C'_0 = D'_1 \string^ D'_3 \string^ D'_5 \string^ D'_7 \quad (6)$$

where $C'_0$ represents a result of performing an exclusive-or operation on all data bits for which low bits of binary index numbers of the input data are 1, and $D'_1 \string^ D'_3 \string^ D'_5 \string^ D'_7$ is a second check code generation expression of the low bits;

$$C'_1 = D'_2 \string^ D'_3 \string^ D'_6 \string^ D'_7 \quad (7)$$

where $C'_1$ represents a result of performing an exclusive-or operation on all data bits for which second low bits of binary index numbers of the input data are 1, and $D'_2 \string^ D'_3 \string^ D'_6 \string^ D'_7$ is a second check code generation expression of the second low bits;

$$C'_2 = D'_4 \string^ D'_5 \string^ D'_6 \string^ D'_7 \quad (8)$$

where $C'_2$ represents a result of performing an exclusive-or operation on all data bits for which high bits of binary index numbers of the input data are 1, and $D'_4 \string^ D'_5 \string^ D'_6 \string^ D'_7$ is a second check code generation expression of the high bits;

furthermore, a second total check code may be set for the second check code, and specifically, as shown in Formula (9):

$$C'_a = D'_0 \string^ D'_1 \string^ D'_2 \string^ D'_3 \string^ D'_4 \string^ D'_5 \string^ D'_6 \string^ D'_7 \quad (9),$$

where $C'_a$ represents a result of performing an exclusive-or operation on all data bits of the input data and is a second total check code, and $D'_0 \string^ D'_1 \string^ D'_2 \string^ D'_3 \string^ D'_4 \string^ D'_5 \string^ D'_6 \string^ D'_7$ is a second total check code generation expression; and $$C' = C'_2 C'_1 C'_0 \quad (10)$$

where C' represents a second check code, $C'_0$ represents a result of performing an exclusive-or operation on all data bits of input data, for which low bits of binary index numbers are 1, $C'_1$ represents a result of performing an exclusive-or operation on all data bits of input data, for which second low bits of binary index numbers are 1, and $C'_2$ represents a result of performing an exclusive-or operation on all data bits of input data, for which high bits of binary index numbers are 1.

Specifically, as shown in Formula (10), after the second check code generation expression of each index number bit of the input data is obtained, a result of the second check code generation expression of each index number bit of the input data is taken as a corresponding bit of the second check code. That is, the result $C'_0$ of the second check code generation expression $D'_1\hat{\ }D'_3\hat{\ }D'_5\hat{\ }D'_7$ of the low bit is taken as a low bit of the second check code; the result $C'_1$ of the second check code generation expression $D'_2\hat{\ }D'_3\hat{\ }D'_6\hat{\ }D'_7$ of the second low bit is taken as a second low bit of the second check code; the result $C'_2$ of the second check code generation expression $D'_4\hat{\ }D'_5\hat{\ }D'_6\hat{\ }D'_7$ of the high bit is taken as a high bit of the second check code; and in such a way, each check bit of the second check code is obtained.

It is not needed to perform an error correcting operation during data writing, and therefore written data is directly output after the first check code and the second check code are obtained; during data reading, if a certain data bit is erroneous, a corresponding bit in the second check code will change; and the erroneous data bit may be determined by comparing the first check code with the second check code. Here, during data reading, it is assumed that errors only occur on a data bit instead of a first check bit.

Specifically, during data reading, an exclusive-or operation is performed on corresponding bits of the first check code and the second check code to obtain respective bits of a third check code, and a specific operation process is shown in the following formulae:

$$S_0 = C_0 \hat{\ } C'_0 \quad (11)$$

where $S_0$ represents a result of performing an exclusive-or operation on a low bit of a first check code and a low bit of a second check code, and $C_0\hat{\ }C'_0$ is a third check code generation expression of a low bit;

$$S_1 = C_1 \hat{\ } C'_1 \quad (12)$$

where $S_1$ represents a result of performing an exclusive-or operation on a second low bit of a first check code and a second low bit of a second check code, and $C_1\hat{\ }C'_1$ is a third check code generation expression of a second low bit;

$$S_2 = C_2 \hat{\ } C'_2 \quad (13)$$

where $S_2$ represents a result of performing an exclusive-or operation on a high bit of a first check code and a high bit of a second check code, and $C_2\hat{\ }C'_2$ is a third check code generation expression of a high bit;

furthermore, a third total check code may be set for the third check code, and specifically, as shown in Formula (14):

$$S_a = C_a \hat{\ } C'_a \quad (14)$$

where $S_a$ represents a result of performing an exclusive-or operation on a first total check code and a second total check code, and $C_a\hat{\ }C'_a$ is a third total check code generation expression; and $$S = S_2 S_1 S_0 \quad (15)$$

where S represents a third check code, $S_0$ represents a result of performing an exclusive-or operation on a low bit of a first check code and a low bit of a second check code, $S_1$ represents a result of performing an exclusive-or operation on a second low bit of a first check code and a second low bit of a second check code, and $S_2$ represents a result of performing an exclusive-or operation on a high bit of a first check code and a high bit of a second check code.

During data reading, if a certain bit among $S_2$, $S_1$ and $S_0$ is 1, it is represented that the $C_2$ bit of the first check code and the $C'_2$ bit of the second check code, or the $C_1$ bit of the first check code and the $C'_1$ bit of the second check code or the $C_0$ bit of the first check code and the $C'_0$ bit of the second check code, corresponding to each other, are inconsistent. Here, the situation that the $S_a$ bit is 1 is omitted, and only the situation that the $S_2$, $S_1$ or $S_0$ bits are 1 is considered. That is, only the situation that a certain data bit corresponding to $C_2$, $C_1$ and $C_0$ is erroneous in a data reading process is considered.

Specifically, during data reading, if the $S_0$ bit is 1 and the $S_2$ and $S_1$ bits are 0, it is represented that the $C_0$ bit of the first check code and the $C'_0$ bit of the second check code are inconsistent, the $C_1$ bit of the first check code and the $C'_1$ bit of the second check code are consistent and the $C_2$ bit of the first check code and the $C'_2$ bit of the second check code are consistent, and according to a first check code generation expression of the $C_0$ bit, it can be seen that a certain data bit among $D_1$, $D_3$, $D_5$ and $D_7$ is erroneous during data reading. That is, one of all data bits for which low bits of binary index numbers are 1 is erroneous.

Similarly, if the $S_1$ bit is 1 and the $S_0$ and $S_2$ bits are 0, it is represented that the $C_1$ bit of the first check code and the $C'_1$ bit of the second check code are inconsistent, the $C_0$ bit of the first check code and the $C'_0$ bit of the second check code are consistent and the $C_2$ bit of the first check code and the $C'_2$ bit of the second check code are consistent, and according to a first check code generation expression of the $C_1$ bit, it can be seen that a certain data bit among $D_2$, $D_3$, $D_6$ and $D_7$ is erroneous during data reading. That is, one of all data bits for which second low bits of binary index numbers are 1 is erroneous.

If the $S_2$ bit is 1 and the $S_0$ and $S_1$ bits are 0, it is represented that the $C_2$ bit of the first check code and the $C'_2$ bit of the second check code are inconsistent, the $C_0$ bit of the first check code and the $C'_0$ bit of the second check code are consistent and the $C_1$ bit of the first check code and the $C'_1$ bit of the second check code are consistent, and according to a first check code generation expression of the $C_2$ bit, it can be seen that a certain data bit among $D_4$, $D_5$, $D_6$ and $D_7$ is erroneous during data reading. That is, one of all data bits for which high bits of binary index numbers are 1 is erroneous. Then, a range of erroneous data bits is concluded according to the corresponding first check code generation expressions.

For example, if S=001, it is represented that the $C_0$ bit of the first check code and the $C'_0$ bit of the second check code are inconsistent. That is, in the data reading process, a certain data bit among $D_1$, $D_3$, $D_5$ and $D_7$ is erroneous; and $D_1$ only exists in the first check code generation expression of the $C_0$ bit, and according to the condition that data bits corresponding to the $C_1$ bit and data bits corresponding to the $C_2$ bit are not erroneous, it can be seen that data bits $D_3$, $D_5$ and $D_7$ are not erroneous, so that it may be judged that the $D_1$ bit is erroneous in the data reading process.

In addition, from S=001, it can be seen that in the data reading process, a certain data bit corresponding to the $C_0$ bit is erroneous and data bits corresponding to the $C_1$ bit and data bits corresponding to the $C_2$ bit are not erroneous; and according to a relationship between the $C_0$, $C_1$ and $C_2$ bits and a binary index number, it can be seen that a low bit of the binary index number corresponding to the erroneous data bit is 1, and a second low bit and a high bit are 0, so it is determined that the binary index number corresponding to the erroneous data bit is a 3-bit binary number 3'b001, and the 3-bit binary number is converted to a decimal number 3'd1. Thus, it may be directly judged that the $D_1$ bit corresponding to a decimal index number 1 is erroneous in the data reading process.

If S=101, it is represented that the $C_0$ bit of the first check code and the $C_2$ bit of the second check code are inconsistent. That is, a certain data bit among $D_1$, $D_3$, $D_4$, $D_5$, $D_6$ and $D_7$ is erroneous in the data reading process, and data bits corresponding to $C_1$ are not erroneous in the data reading process; and only $D_5$ exists in the first check code generation expressions of the $C_0$ bit and the $C_2$ bit simultaneously and does not exist in the first check code generation expression of the $C_1$ bit, and therefore it may be judged that the $D_5$ bit is erroneous in the data reading process.

In addition, from S=101, it can be seen that in the data reading process, a certain data bit of data bits corresponding to the $C_0$ bit and data bits corresponding to the $C_2$ bit is erroneous and data bits corresponding to the $C_1$ bit are not erroneous in the data reading process; and according to a relationship between the $C_0$, $C_1$ and $C_2$ bits and a binary index number, it can be seen that a low bit of the binary index number corresponding to the erroneous data bit is 1, a second low bit is 0, and a high bit is 1, so it is determined that the binary index number corresponding to the erroneous data bit is a 3-bit binary number 3'b101, and the 3-bit binary number is converted to a decimal number 3'd5. Thus, it may be directly judged that the $D_5$ bit corresponding to a decimal index number 5 is erroneous in the data reading process.

Furthermore, in view of that a decimal index number corresponding to the $D_0$ bit is 0, a binary index number is 000 and the $D_0$ bit is the only data bit which does not exist in the first check code generation expressions of the $C_2$, $C_1$ and $C_0$ bits, if all of the $C_2$, $C_1$ and $C_0$ bits in S are 0 and $S_a$ is 1, it is represented that the $D_0$ bit is erroneous during data reading; if not all of the $C_2$, $C_1$ and $C_0$ bits in S are 0 and $S_a$ is 0, it is represented that two bits are erroneous during data reading; and in this case, it is beyond an error correcting capability, it is directly reported, to an operating system, that errors cannot be corrected, and the operating system decides whether it is needed to discard the data and to re-read data.

According to the first check code generation expression of the $C_2$ bit, it can be seen that only $D_4$, $D_5$, $D_6$ and $D_7$ participate in the first check code generation expression of the $C_2$; in this way, if it is needed to apply the method to the situation that a data bit width is 4 bits, the $C_2$ bit may be omitted; and due to the fact that the $D_4$, $D_5$, $D_6$ and $D_7$ bits do not exist in four-bit data, by filling corresponding data bits in the first check code generation expressions and the second check code generation expressions with 0 or 1, a final result of a third check code may not be influenced, so the method may be simply reused to an application where the data bit width is 4 bits. Thus, by means of a similar method, the embodiments of the disclosure may be promoted to an application where a data bit width is 32 bits, 64 bits, 128 bits or higher bits.

In practical application, since the first check code is probably erroneous in an access process, an inspection check code may be further set, and it is judged whether the first check code is erroneous in the access process by means of the change of the inspection check code. Specifically, as shown in Formula (16):

$$C_c = C_2 \hat{\ } C_1 \hat{\ } C_0 \hat{\ } C_a \qquad (16),$$

where $C_c$ represents an inspection check code, $C_2$ represents a result of performing an exclusive-or operation on all data bits for which high bits of binary index numbers are 1, $C_1$ represents a result of performing an exclusive-or operation on all data bits for which second low bits of binary index numbers are 1, $C_0$ represents a result of performing an exclusive-or operation on all data bits for which low bits of binary index numbers are 1, and $C_a$ represents a result of performing an exclusive-or operation on all data bits.

In practical application, a user only concerns valid data, so if errors occur in a first check code, it is not needed to perform an error correcting operation, and it is directly reported, to an operating system, that the first check code is erroneous.

Here, after an erroneous data bit is determined, the erroneous data bit is corrected. A specific correcting process is the traditional art, which will not be elaborated herein.

Figure 5:
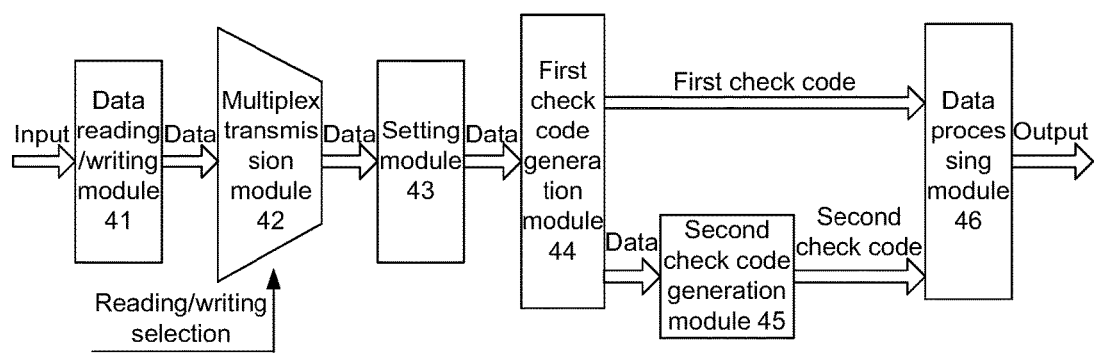
FIG. 5 is a schematic diagram of a circuit framework of a data error correcting apparatus embodiment of the disclosure.

According to an embodiment of the disclosure, a data error correcting apparatus is provided. Data input may be data writing or data reading, and a reading/writing selection signal determines whether data reading or data writing is performed currently. That is, the reading/writing selection signal controls an entire circuit to perform an error correcting operation or an operation of generating a first check code and a second check code. FIG. 4 is a schematic diagram of a composition structure of a data error correcting apparatus embodiment of the disclosure. FIG. 5 is a schematic diagram of a circuit framework of a data error correcting apparatus embodiment of the disclosure. As shown in FIG. 4 and FIG. 5, the apparatus includes: a setting module 43, a first check code generation module 44, a second check code generation module 45 and a data processing module 46, wherein the setting module 43 is configured to set an index number for each data bit; and specifically, the setting module 43 is configured to set a binary index number for each data bit in an order of data bits.

The first check code generation module 44 is configured to generate a first check code according to the index numbers.

Specifically, during data reading or data writing, the first check code generation module 44 is configured to perform an exclusive-or operation on data bits for which corresponding bits of respective binary index numbers are 1 or 0, for the binary index numbers for the respective data bits, and obtain a first check code generation expression of each index number bit and take a result of the first check code generation expression of each index number bit as a corresponding bit of the first check code.

The first check code generation module 44 is further configured to obtain a first total check code by performing an exclusive-or operation on all data bits.

For an application where it is needed to performs reading operation and a writing operation simultaneously, a data reading first check code generation module and a data writing first check code generation module may be provided separately, and the data reading first check code generation module and the data writing first check code generation module generate respective first check codes independently; and for an application where it is not needed to perform the reading operation and the writing operation simultaneously, only one first check code generation module may be provided so as to reduce the scale of hardware logics.

The second check code generation module 45 is configured to generate a second check code according to the first check code.

Specifically, during data reading or data writing, the second check code generation module 45 is configured to perform an exclusive-or operation on data bits of input data, for which corresponding bits of respective binary index numbers are 1 or 0 for the binary index numbers for the respective data bits of the input data, and obtain a second check code generation expression of each index number bit and take a result of the second check code generation expression of each index number bit as a corresponding bit of the second check code.

For an application where it is needed to perform the reading operation and the writing operation simultaneously, a data reading second check code generation module and a data writing second check code generation module may be provided separately, and the data reading second check code generation module and the data writing second check code generation module generate respective second check codes independently; and for an application where it is not needed to perform the reading operation and the writing operation simultaneously, only one second check code generation module may be provided so as to reduce the scale of hardware logics.

The second check code generation module 45 is further configured to obtain a second total check code by performing an exclusive-or operation on all data bits of the input data.

The data processing module 46 is configured to compare the first check code with the second check code to determine an erroneous data bit, and correct the erroneous data bit.

Specifically, during data reading, the data processing module 46 is configured to perform an exclusive-or operation on each bit of the first check code and a responding bit of the second check code to obtain a corresponding bit of a third check code, determine, when it is determined that the corresponding bits of the first check code and the second check code are inconsistent according to the third check code, an erroneous data bit according to the first check code generation expressions of the corresponding bits of the first check code, correct the erroneous data bit, and then output the corrected data; and since it is not needed to perform an error correcting operation during data writing, the data processing module 46 directly outputs the written data.

In addition, since it is not needed to perform the error correcting operation during data writing, the reading operation and the writing operation may share a data processing module.

Furthermore, the apparatus may include: a data reading/writing module 41 and a multiplex transmission module 42, wherein the data reading/writing module 41 is configured to transmit data in a reading operation or a writing operation; and for an application where it is needed to perform the reading operation and the writing operation simultaneously, a data reading module and a data writing module may be provided separately, and the data reading module and the data writing module transmit the data in the reading operation or the writing operation independently.

The multiplex transmission module 42 is configured to transmit the data of the data reading/writing module.

Specifically, when it is needed to perform data writing, a reading/writing selection signal enables the writing operation, the multiplex transmission module 42 selects the data of the data reading/writing module to be input to the setting module 43; and when it is needed to perform data reading, the reading/writing selection signal enables the reading operation, the multiplex transmission module 42 selects the data of the data reading/writing module to be input to the setting module 43.

In practical application, the multiplex transmission module 42 may be implemented by a multiplexer; the data reading/writing module 41, the setting module 43, the first check code generation module 44, the second check code generation module 45 and the data processing module 46 may be implemented by a Central Processing Unit (CPU), a Digital Signal Processor (DSP) or a Field Programmable Gate Array (FPGA).

According to an embodiment of the disclosure, a computer storage medium is also provided. Computer executable instructions are stored in the computer storage medium and are configured to perform the method according to the embodiment of the disclosure.

If the data error correcting method in the embodiment of the disclosure is implemented in a form of a software function module and is sold or used as an independent product, the product may also be stored in a computer readable storage medium. Based on this understanding, those skilled in the art shall understand that the embodiments of the disclosure may be provided as a method, a system or a computer program product. Thus, forms of hardware embodiments, software embodiments or embodiments combining software and hardware may be adopted in the disclosure. Moreover, a form of computer program product implemented on one or more computer available storage media containing computer available program codes may be adopted in the disclosure. The storage media include, but are not limited to, a U disk, a mobile hard disk, a Read-Only Memory (ROM), a magnetic disk memory, a CD-ROM, an optical memory and the like.

The disclosure is described with reference to flowcharts and/or block diagrams of a method, an apparatus and a computer program product according to the embodiments of the disclosure. It will be appreciated that each flow and/or block in the flowcharts and/or the block diagrams and the combination of the flows and/or the blocks in the flowcharts and/or the block diagrams may be implemented by computer program instructions. These computer program instructions may be provided for a general purpose computer, a dedicated computer, an embedded processor or processors of other programmable data processing devices to generate a machine, such that an apparatus for achieving functions designated in one or more flows of the flowcharts and/or one or more blocks of the block diagrams is generated via instructions executed by the processors of the computers or the other programmable data processing devices.

These computer program instructions may also be stored in a computer readable memory capable of guiding the computers or the other programmable data processing devices to work in a specific mode, such that a manufactured product including an instruction apparatus is generated via the instructions stored in the computer readable memory, and the instruction apparatus achieves the functions designated in one or more flows of the flowcharts and/or one or more blocks of the block diagrams.

These computer program instructions may also be loaded onto the computers or the other programmable data processing devices, such that processing implemented by the computers is generated by performing a series of operation steps on the computers or the other programmable devices, and therefore the instructions performed on the computers or the other programmable devices provide a step of achieving the functions designated in one or more flows of the flowcharts and/or one or more blocks of the block diagrams.

Correspondingly, according to an embodiment of the disclosure, a computer storage medium is also provided. Computer programs are stored therein and are configured to perform the method for correcting the data error according to the method embodiment of the disclosure.

The above is only the preferred embodiments of the disclosure and is not intended to limit the protective scope of the disclosure.

What is claimed is:

1. A method performed by one or more processors for correcting data error during reading data from a random access memory (RAM), wherein the one or more processors execute computer readable instructions to implement a plurality of modules, the plurality of modules include a setting module, a first check code generation module, a second check code generation module and a data processing module, the method comprising:

setting, by the setting module, a binary index number for each data bit in an order of data bits, and obtaining, by the first check code generation module, first check code generation expressions according to the binary index numbers, and generating, by the first check code generation module, a first check code according to the first check code generation expressions; and generating, by the second check code generation module, a second check code according to the first check code, comparing, by the data processing module, the first check code with the second check code to determine an erroneous data bit, and correcting the erroneous data bit;

wherein the step of obtaining, by the first check code generation module, first check code generation expressions according to the binary index numbers and generating, by the first check code generation module, the first check code according to the first check code generation expressions comprises: performing, by the first check code generation module, an exclusive-or operation on data bits for which corresponding bits of respective binary index numbers are 1 or 0, for the binary index numbers for the respective data bits, and obtaining, by the first check code generation module, a first check code generation expression of each index number bit and taking a result of the first check code generation expression of each index number bit as a corresponding bit of the first check code.

2. The method according to claim 1, wherein the step of generating, by the second check code generation module, a second check code according to the first check code comprises:

performing, by the second check code generation module, an exclusive-or operation on data bits of input data, for which corresponding bits of the respective binary index numbers are 1 or 0, for the binary index numbers for the respective data bits of the input data, and obtaining, by the second check code generation module, a second check code generation expression of each index number bit and taking a result of the second check code generation expression of each index number bit as a corresponding bit of the second check code.

3. The method according to claim 2, wherein the step of comparing, by the data processing module, the first check code with the second check code to determine an erroneous data bit and correcting, by the data processing module, the erroneous data bit comprises:

performing, by the data processing module, an exclusive-or operation on each bit of the first check code and a corresponding bit of the second check code to obtain a corresponding bit of a third check code, when it is determined that the corresponding bits of the first check code and the second check code are inconsistent according to the third check code, determining, by the data processing module, an erroneous data bit according to the first check code generation expressions of the corresponding bits of the first check code, and correcting, by the data processing module, the erroneous data bit.

4. The method according to claim 1, wherein the step of comparing, by the data processing module, the first check code with the second check code to determine an erroneous data bit and correcting, by the data processing module, the erroneous data bit comprises:

performing, by the data processing module, an exclusive-or operation on each bit of the first check code and a corresponding bit of the second check code to obtain a corresponding bit of a third check code, when it is determined that the corresponding bits of the first check code and the second check code are inconsistent according to the third check code, determining, by the data processing module, an erroneous data bit according to the first check code generation expressions of the corresponding bits of the first check code, and correcting, by the data processing module, the erroneous data bit.

5. An apparatus for correcting data error during reading data from a random access memory (RAM), comprising: one or more processors executing computer readable instructions to implement a plurality of modules, the plurality of modules include a setting module, a first check code generation module, a second check code generation module and a data processing module, wherein the setting module is configured to set a binary index number for each data bit in an order of data bits;

the first check code generation module is configured to obtain first check code generation expressions according to the binary index numbers, and generate a first check code according to the first check code generation expressions;

the second check code generation module is configured to generate a second check code according to the first check code; and the data processing module is configured to compare the first check code with the second check code to determine an erroneous data bit, and correct the erroneous data bit;

wherein the first check code generation module is configured to perform an exclusive-or operation on data bits for which corresponding bits of respective binary index numbers are 1 or 0, for the binary index numbers for the respective data bits, and obtain a first check code generation expression of each index number bit and take a result of the first check code generation expression of each index number bit as a corresponding bit of the first check code.

6. The apparatus according to claim 5, wherein the second check code generation module is configured to perform an exclusive-or operation on data bits of input data, for which corresponding bits of respective binary index numbers are 1 or 0, for the binary index numbers for the respective data bits of the input data, and obtain a second check code generation expression of each index number bit and take a result of the second check code generation expression of each index number bit as a corresponding bit of the second check code.

7. The apparatus according to claim 6, wherein the data processing module is configured to perform an exclusive-or operation on each bit of the first check code and a corresponding bit of the second check code to obtain a corresponding bit of a third check code, determine, when it is determined that the corresponding bits of the first check code and the second check code are inconsistent according to the third check code, an erroneous data bit according to the first check code generation expressions of the corresponding bits of the first check code, and correct the erroneous data bit.

8. The apparatus according to claim 5, wherein the data processing module is configured to perform an exclusive-or operation on each bit of the first check code and a corresponding bit of the second check code to obtain a corresponding bit of a third check code, determine, when it is determined that the corresponding bits of the first check code and the second check code are inconsistent according to the third check code, an erroneous data bit according to the first check code generation expressions of the corresponding bits of the first check code, and correct the erroneous data bit.

9. The apparatus according to claim 5, wherein the data processing module is configured to perform an exclusive-or operation on each bit of the first check code and a corresponding bit of the second check code to obtain a corresponding bit of a third check code, determine, when it is determined that the corresponding bits of the first check code and the second check code are inconsistent according to the third check code, an erroneous data bit according to the first check code generation expressions of the corresponding bits of the first check code, and correct the erroneous data bit.

10. A non-transitory computer storage medium storing therein computer executable instructions for performing the steps of:
  setting a binary index number for each data bit in an order of data bits, and obtaining first check code generation expressions according to the binary index numbers, and generating a first check code according to the first check code generation expressions; and
  generating a second check code according to the first check code, comparing the first check code with the second check code to determine an erroneous data bit, and correcting the erroneous data bit;
  the step of obtaining first check code generation expressions according to the binary index numbers and generating the first check code according to the first check code generation expressions comprises: performing an exclusive-or operation on data bits for which corresponding bits of respective binary index numbers are 1 or 0, for the binary index numbers for the respective data bits, and obtaining a first check code generation expression of each index number bit and taking a result of the first check code generation expression of each index number bit as a corresponding bit of the first check code.

11. The method according to claim 1, wherein the step of comparing, by the data processing module, the first check code with the second check code to determine an erroneous data bit and correcting, by the data processing module, the erroneous data bit comprises:
  performing, by the data processing module, an exclusive-or operation on each bit of the first check code and a corresponding bit of the second check code to obtain a corresponding bit of a third check code, when it is determined that the corresponding bits of the first check code and the second check code are inconsistent according to the third check code, determining, by the data processing module, an erroneous data bit according to the first check code generation expressions of the corresponding bits of the first check code, and correcting, by the data processing module, the erroneous data bit.

12. The non-transitory computer storage medium according to claim 10, wherein the step of generating a second check code according to the first check code comprises:
  performing an exclusive-or operation on data bits of input data, for which corresponding bits of the respective binary index numbers are 1 or 0, for the binary index numbers for the respective data bits of the input data, and obtaining a second check code generation expression of each index number bit and taking a result of the second check code generation expression of each index number bit as a corresponding bit of the second check code.

* * * * *